United States Patent
Lumbab

(10) Patent No.: US 8,766,649 B1
(45) Date of Patent: Jul. 1, 2014

(54) PROXIMITY SENSOR INTERFACE DEVICE AND METHOD FOR ITS USE

(75) Inventor: Alex C. Lumbab, Bothell, WA (US)

(73) Assignee: The Boeing Company, Chicago, IL (US)

( * ) Notice: Subject to any disclaimer, the term of this patent is extended or adjusted under 35 U.S.C. 154(b) by 397 days.

(21) Appl. No.: 13/034,322

(22) Filed: Feb. 24, 2011

Related U.S. Application Data

(63) Continuation-in-part of application No. 12/572,630, filed on Oct. 2, 2009.

(51) Int. Cl.
G01R 27/28 (2006.01)
G01R 27/26 (2006.01)

(52) U.S. Cl.
USPC .......................................... 324/654; 324/677

(58) Field of Classification Search
CPC ................. G01R 27/2611; G01D 5/20; G05B 2219/37277
USPC ............................. 324/677, 207.15
See application file for complete search history.

(56) References Cited

U.S. PATENT DOCUMENTS

| | | | | |
|---|---|---|---|---|
| 4,219,740 A | * | 8/1980 | Little ............................ | 307/116 |
| 4,649,341 A | * | 3/1987 | Ulbrich et al. ........... | 324/207.16 |
| 4,771,359 A | * | 9/1988 | Link ............................ | 361/179 |
| 4,843,259 A | * | 6/1989 | Weisshaupt .................... | 327/510 |
| 5,410,488 A | | 4/1995 | Andersen, III | |
| 5,831,597 A | | 11/1998 | West et al. | |
| 7,358,720 B1 | | 4/2008 | Maier | |
| 7,586,303 B2 | | 9/2009 | Kirchdoerffer et al. | |
| 8,115,498 B1 | | 2/2012 | Lumbab | |
| 8,258,777 B2 | * | 9/2012 | Chen ........................ | 324/207.15 |
| 2001/0019262 A1 | * | 9/2001 | Woolsey et al. ......... | 324/207.26 |
| 2003/0071638 A1 | * | 4/2003 | Machul .......................... | 324/654 |
| 2005/0151719 A1 | | 7/2005 | Geddes et al. | |
| 2005/0162158 A1 | * | 7/2005 | Del Monte ............... | 324/207.26 |
| 2006/0056575 A1 | * | 3/2006 | Mehnert et al. .................. | 377/89 |
| 2006/0250143 A1 | | 11/2006 | Moon et al. | |
| 2008/0305709 A1 | | 12/2008 | Chan | |
| 2010/0130099 A1 | * | 5/2010 | Manuel et al. ..................... | 451/5 |

FOREIGN PATENT DOCUMENTS

FR 2604251 A1 3/1988
WO WO 2011012843 A1 * 2/2011

OTHER PUBLICATIONS

Gorden K. Smyth, "Polynomial Approximation", 1998, John Wiley $ Sons, Ltd, Chchester. http://www.statsci.org/smyth/pubs/EoB/bap064-.pdf.*
Donna Roberts, "Normal Distribution", Nov. 20, 2008, regentsprep.org http://www.regentsprep.org/Regents/math/algtrig/ATS2/NormalLesson.htm.*
Wolfram, "Standard Deviation", Apr. 2, 2008, mathworld.wolfram.com http://mathworld.wolfram.com/StandardDeviation.html.*
Extended European Search Report for EP App. No. 12156989.1—2213 dated Jun. 14, 2012, 6 pgs.

* cited by examiner

Primary Examiner — Jermele M Hollington
Assistant Examiner — Hoang X Nguyen
(74) Attorney, Agent, or Firm — Armstrong Teasdale LLP

(57) ABSTRACT

A proximity sensor interface device (PSID) for determining if a proximity sensor is in an acceptable position with respect to a target device is described. The PSID includes a frequency generator, a processing device, a memory associated with the processing device, a display, and an RC circuit. The processing device is programmed to route a signal generated by the frequency generator through the proximity sensor and the RC circuit for a prescribed period of time and the processing device is programmed to measure a discharge time of the RC circuit. The processing device is further programmed to cause the display to provide an indication of whether the relative position of the proximity sensor and the target device are within prescribed tolerances, based on the discharge time.

19 Claims, 13 Drawing Sheets

PROXIMITY SENSOR INTERFACE DEVICE AND METHOD FOR ITS USE

CROSS-REFERENCE TO RELATED APPLICATIONS

This application is a continuation-in-part application of patent application Ser. No. 12/572,630, filed Oct. 2, 2009 and titled "PROXIMITY SENSOR INTERFACE DEVICE AND METHOD FOR ITS USE", the contents of which are hereby incorporated by reference in its entirety.

BACKGROUND

The field of the invention relates generally to the measurement of air gaps between proximity sensors and related metal targets, and more specifically to a proximity sensor interface device for verifying the correct air gap between a proximity sensor and a metal target.

In one application, proximity sensors for pressurized access doors are difficult to mechanically test due to limited space constraints both within the small confines of the sensor installation itself and the general area where the access door is located. Proper rigging (mechanical placement) of the proximity sensors is critical to provide a true indication of the access door's latched (or unlatched) condition. When the proximity sensors are not properly located in such an application, one result may be a false indication which may result in unnecessary flight delays.

Currently, there are three solutions that are utilized to ensure proper mechanical placement of proximity sensors in the access door application. In the first solution, the access doors are mechanically rigged either at pre-integration or final assembly and delivery mechanically using modified bent-up feeler gauges. However, limited space constraints make it virtually impossible to mechanically rig the proximity sensors. More specifically, due to the relatively tight space inside the sensor installation, it is difficult to get hard feeler gauges into the space to successfully measure the gap between the proximity sensor and its target mechanism. Moreover, the modified bent-up gauges currently utilized are not accurate and difficult to insert into the air gap. Clay or metrological rubber is also difficult to apply because the access door sensor application is a sliding joint. As a result, capturing the true air gap in a modeling medium is also not very accurate.

The second solution is an internal proximity sensor rigging aid, which is a tool available on maintenance laptop computers which provides the capability to electronically rig the proximity sensors. This device and program utilize the aircraft's on-board proximity sensor data concentrator and general processing modules to drive/interrogate the sensors in exactly the same way as in actual ground operation/flight. However, this solution assumes that power is available on the aircraft. In most access door rigging manufacturing sequences, the doors are installed and the proximity sensors are rigged at pre-integration sites. As such, systems and aircraft power may not necessarily be available.

Another device is known that electronically rigs the proximity sensors. However, this device is a relatively large unit and so placement of the device conveniently within the confined aircraft space to test the proximity sensor is questionable. More specifically, this proximity sensor device requires a reference inductor in order to determine the air gap between a proximity sensor face and an associated target mechanism.

BRIEF DESCRIPTION

In one aspect, a proximity sensor interface device (PSID) for determining if a proximity sensor is in an acceptable position with respect to a target device is provided. The device includes a frequency generator, a processing device, a memory associated with the processing device, a display, and an RC circuit. The processing device is programmed to route a signal generated by the frequency generator through the proximity sensor and the RC circuit for a prescribed period of time. The processing device is also programmed to measure a discharge time of the RC circuit. The processing device is further programmed to cause the display to provide an indication of whether the relative position of the proximity sensor and the target device are within prescribed tolerances, based on the discharge time.

In another aspect, a method for determining if a proximity sensor is in an acceptable position with respect to a target mechanism is provided. The method includes applying a signal of known frequency to the proximity sensor and a RC circuit electrically coupled to the proximity sensor for a prescribed period of time, measuring the discharge time of the RC circuit with a processing device, and providing a display indicative of whether the relative position of the proximity sensor and the target device are within prescribed tolerances, based on the discharge time.

The features, functions, and advantages that have been discussed can be achieved independently in various embodiments of the present invention or may be combined in yet other embodiments further details of which can be seen with reference to the following description and drawings.

DETAILED DESCRIPTION

Embodiments described herein relate to a proximity sensor interface device (PSID) that is a portable, hand-held, self-powered, electronic device capable of interfacing, for example, with the proximity sensors deployed on an air vehicle. The PSID is a gap measurement device utilized to "electronically" rig such inductive-type proximity sensors. More specifically, the described PSID is a device that electronically measures a gap perceived by a proximity sensor, the perceived gap being between the proximity sensor and its corresponding metal target. The gap between a proximity sensor and its corresponding target is sometimes referred to as an air gap.

As further described, the PSID is a portable, hand-held, self-powered unit that can both drive and interrogate a proximity sensor. The PSID is able to drive and interrogate proximity sensors regardless if power is available on, for example, an aircraft. In one embodiment, which is further described below, the device utilizes a simple frequency generator and an RC circuit to provide measurement of the air gap. The measure of time for the RC circuit to decay after it has been charged via the driven proximity sensor, generally an inductive proximity sensor, can be converted into perceived air gap. After calibration, the PSID uses an existing aircraft sensor as the measuring tool and reports the perceived gap registered by the sensor and its corresponding target. Current embodiments of the PSID, as further explained below, operate in two modes: a Gap Measurement mode and a Go/No-Go mode.

Figure 1:
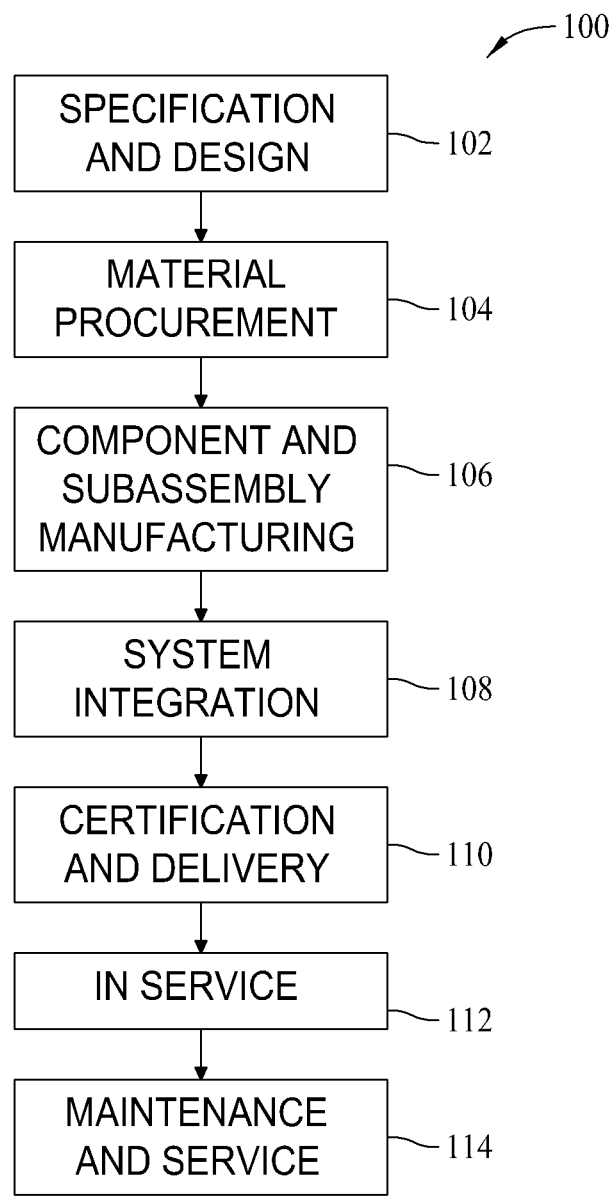
FIG. 1 is a flow diagram of an aircraft production and service methodology.
Figure 2:
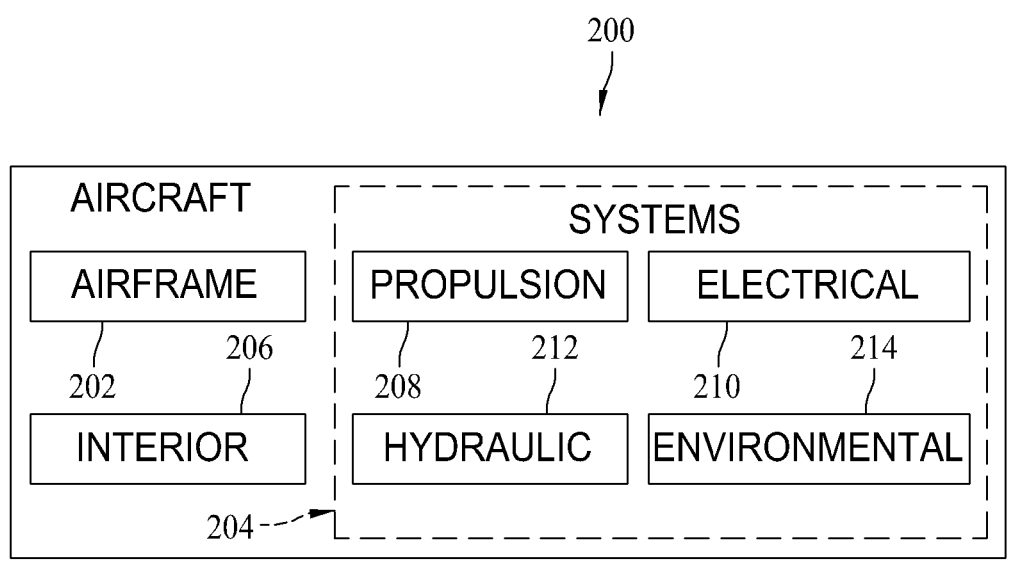
FIG. 2 is a block diagram of an aircraft.

Referring more particularly to the drawings, embodiments of the disclosure may be described in the context of aircraft manufacturing and service method 100 as shown in FIG. 1 and an aircraft 200 as shown in FIG. 2. During pre-production, aircraft manufacturing and service method 100 may include specification and design 102 of aircraft 200 and material procurement 104.

During production, component and subassembly manufacturing 106 and system integration 108 of aircraft 200 takes place. Thereafter, aircraft 200 may go through certification and delivery 110 in order to be placed in service 112. While in service by a customer, aircraft 200 is scheduled for routine maintenance and service 114 (which may also include modification, reconfiguration, refurbishment, and so on).

Each of the processes of aircraft manufacturing and service method 100 may be performed or carried out by a system integrator, a third party, and/or an operator (e.g., a customer). For the purposes of this description, a system integrator may include, without limitation, any number of aircraft manufacturers and major-system subcontractors; a third party may include, for example, without limitation, any number of vendors, subcontractors, and suppliers; and an operator may be an airline, leasing company, military entity, service organization, and so on.

As shown in FIG. 2, aircraft 200 produced by aircraft manufacturing and service method 100 may include airframe 202 with a plurality of systems 204 and interior 206. Examples of systems 204 include one or more of propulsion system 208, electrical system 210, hydraulic system 212, and environmental system 214. Any number of other systems may be included in this example and many of these are known to incorporate proximity sensors. Although an aerospace example is shown, the principles of the disclosure may be applied to other industries, such as the automotive industry.

Apparatus and methods embodied herein may be employed during any one or more of the stages of aircraft manufacturing and service method 100. For example, without limitation, components or subassemblies corresponding to component and subassembly manufacturing 106 may be fabricated or manufactured in a manner similar to components or subassemblies produced while aircraft 200 is in service.

Also, one or more apparatus embodiments, method embodiments, or a combination thereof may be utilized during component and subassembly manufacturing 106 and system integration 108, for example, without limitation, by substantially expediting assembly of or reducing the cost of aircraft 200. In addition, one or more apparatus embodiments, method embodiments, or a combination thereof may be utilized during certification and delivery 110 for example, but without limitation, qualification testing of said components or subassemblies that employ proximity sensors in order to satisfy certification testing requirements. Similarly, one or more of apparatus embodiments, method embodiments, or a combination thereof may be utilized while aircraft 200 is in service, for example, without limitation, during system integration 108 and/or maintenance and service 114 to determine whether parts may be connected and/or mated to each other.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

As mentioned above, embodiments of the PSID operate in two modes, a Gap Measurement mode and a Go/No-Go mode. The Gap Measurement mode is used to report out the gap, in inch units. In embodiments, the gap is actually reported out in three values: 1) Gap Min, 2) Gap Max, and 3) Gap Nom. The reason for a range in gap output is because of the nature of inductance. Specifically, the PSID can only register a "perceived" gap and not a true gap. For example, two separate build configurations can have the same physical gap between the sensor face and the target (measured using a gauge pin) but one target is vertically offset by some distance. Even though the physical gap is the same, the "perceived" gap of the offset configuration would be larger because the inductance has changed due to less target surface area being presented to the sensor.

To compensate for this perceived gap phenomena, the gap measuring methodology used by embodiments of the PSID is actually based on two sensor response curves. This sensor response envelope is bounded by a high response (best-case) and low response (worst-case) curves. The sensor/target is first configured with the target true to the sensor face and then gapped through the effective range to generate the high response curve. The configuration is then changed to a worst-case configuration (angular and vertical misalignment incorporated based on a thorough tolerance analysis of that particular installation) and the test repeated to generate the low response curve. The sensor response envelope is then defined by the area bound between both of these curves and the min/max gap defined by the corresponding rigging requirements.

Provided all manufacturing tolerances have been met for all components in the installation, the sensor/target configuration should never exceed either of these curves. For each output, the device will report a corresponding Gap Min (low response) and Gap Max (high response) based on the calibration data. The current Gap Nom is simply an arithmetic average of Gap Min and Gap Max. This value could be improved or eliminated if it is found to be unnecessary. In reality, the true gap will most likely be somewhere in between these two values, perhaps a bit closer to the Gap Max value. The reason for this is that the gap is checked with the aircraft unpressurized so the target will most likely be in a relaxed state and therefore the inductance is artificially increased. The reported gap range should be interpreted such that if neither Gap Min or Gap Max exceed the rigging gap minimum or rigging gap maximum values, respectively, then the installation shall be considered conformed to the rigging requirements. If $3\sigma$ standard deviations are used to generate the error in the sensor response curves and the total sensor response envelope is encapsulated with the error bars, then there is a 99.7% confidence level that the true gap falls within the gap range reported results.

The Go/No-Go Mode is simply a visual tool to graphically show the gap measurement via a "fuel gauge"-type configuration. The output is defined by two limit bars that represent the minimum and maximum gap requirements as defined by a particular sensor/target installation. A moving needle shows the current sensor gap measurement within limit bars. This mode can also indicate "Go" or "No-Go" to quickly provide to the user whether or not the current sensor gap is acceptable.

Figure 3:
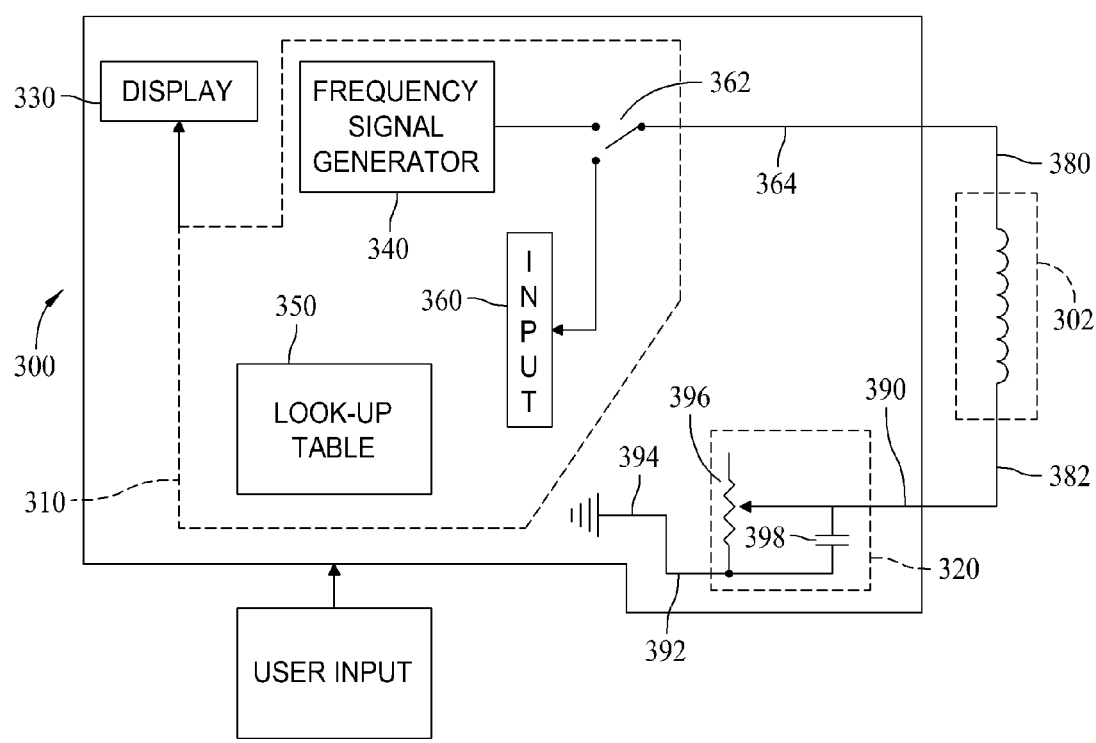
FIG. 3 is a schematic diagram of a proximity sensor interface device (PSID).

FIG. 3 is a schematic diagram that illustrates one embodiment of a PSID 300 that is interconnected to a proximity sensor 302. The PSID 300 includes a processing device 310 which accepts user input and an RC circuit 320. The processing device is configured to drive a display 330. In the illustrated embodiment, the processing device 310 includes a frequency signal generator 340, a look up table 350, and at least one input 360 that interfaces through an internal switch 362 with a first lead 380 of the proximity sensor 302 under test and the frequency generator 340. A second lead 382 of the proximity sensor 302 under test is connected to a first lead 390 of the RC circuit 320. A second lead 392 of the RC circuit 320 is connected to ground 394.

Switch 362, in one embodiment, is an internal switch controlled by the processing device 310. In the illustrated embodiment, lead 380 is actually connected to a single pin 364 of the processing device 310. As illustrated by the depiction of switch 362, pin 364 can change state between an input function, routing a signal to input 360, and an output function, routing a signal from frequency signal generator 340 to lead 380 of proximity sensor 302. In other words, pin 364 is in an output state, it is supplying the frequency signal, and when it is in an input state, it allows processing device 310 to measure the RC decay time through input 360.

In the illustrated embodiment, the resistor 396 and the capacitor 398 of the RC circuit 320 are in parallel, and in the illustrated embodiment the resistor 396 is a variable resistor that is electrically connected so that parameters of the RC circuit 320 can be varied by changing the resistance associated with the RC circuit 320.

As apparent from the schematic, PSID 300 is a portable, hand-held, self-powered unit that can both drive and interrogate the proximity sensor 302. The frequency signal generator 340 drives the proximity sensor 302 and subsequently charges the RC circuit 320. As the RC circuit 320 is discharged, its drop in voltage is fed through switch 362 and into the input 360 of processing device 310 for analysis. As stated above, PSID 300 simplifies the electronics into a simple frequency generator and RC circuit to provide measurement of the air gap between the proximity sensor and its target mechanism. More specifically, and in one embodiment, the measurement of time for the RC circuit 320 to decay after it has been charged via the driven proximity sensor 302 can be converted into a perceived air gap.

In one embodiment, the proximity sensor 302 is driven by a PWM frequency generator (frequency generator 340) that inputs a signal of known frequency into the inductive proximity sensor 302. At the same time, RC circuit 320 being charged by the output voltage imparted via the proximity sensor 302. Because the embodiment of proximity sensor 302 is inductive, it generates a magnetic field forward of the sensor face as the sensor 302 is being excited by the frequency signal. As programmed into processing device 310, the signal of known frequency is active for a prescribed amount of time and then is turned off. Immediately afterwards, the processing device, 310, such as a microcontroller, switches to input mode, allowing discharge of the RC circuit 320 back into the processing device 310 for analysis.

The processing device 310 is programmed to measure the amount of time it takes the RC circuit 320 to discharge, for example, in time units. The time measurement device may comprise of a high speed counter or equivalent circuitry with resolution sufficient to properly capture the RC circuit discharge time as the RC circuit decays from its charged voltage state to a pre-determined threshold voltage close to or at zero volts. The amount of charge, and therefore its discharge time, is directly proportional to the perceived gap between the sensor face of proximity sensor 302 and the associated target mechanism. In one embodiment, the processing device is configured with a look up table that describes the relationship between a discharge time of the RC circuit 320 and the gap between the face of the proximity sensor 302 and the target mechanism. Because the target mechanism interferes with the magnetic field in a uniform manner, its distance relative to the sensor face will change the level of charge of the RC circuit 320, and thus a discharge time of the RC circuit 320. In one embodiment, the processing device 310 loops this process many times per second and so the output of the PSID 300 will continuously provide an indication of output discharge times and provide live data of the gap between the proximity sensor 302 and its target mechanism as the gap changes. One embodiment of this indication is described with respect to FIGS. 4-6.

PSID 300 is utilized to electronically rig proximity sensor 302 in lieu of the above described mechanical gauging. Electronic rigging of the sensor means that mechanical rigging of the proximity sensors with modified tooling is not needed. Electronic rigging is also more accurate than mechanical rigging, at least in certain proximity sensor applications, due to space constraints.

In embodiments, PSID 300 includes an integral power supply to drive itself as well as the proximity sensor 302 under test so PSID 300 is a stand-alone unit. As such, aircraft power is not needed to electronically rig the sensors as is done in certain applications.

The key component is the RC circuit 320 that is connected in parallel to frequency signal generator 340 via the proximity sensor 302 being measured for gap. The proximity sensors utilized are of the inductive-type and fabricated from an inductor coil with no on-board processing electronics.

When the proximity sensor 302 is "pulsed", the frequency signal generator 340 outputs a sine wave voltage with a set frequency for a prescribed amount of time. The RMS voltage output from the proximity sensor 302 is then modulated via the inductance property of the proximity sensor 302 itself as the magnetic field generated at the face of the sensor 302 is affected by the corresponding metal target.

This voltage level is subsequently captured via the RC circuit 320 and then quickly measured for the time it takes the RC circuit 320 to decay below some threshold (approximately 1.4 VDC). A micro-controller is utilized as the processing device 310 to capture this time via an RCTIME command. It has been shown that this time output (in milliseconds) is proportional to the physical gap between the sensor 302 and the target and that this output is repeatable to an acceptable precision that allows the device to be used as an accurate/precise gap measurement tool.

Figure 4:
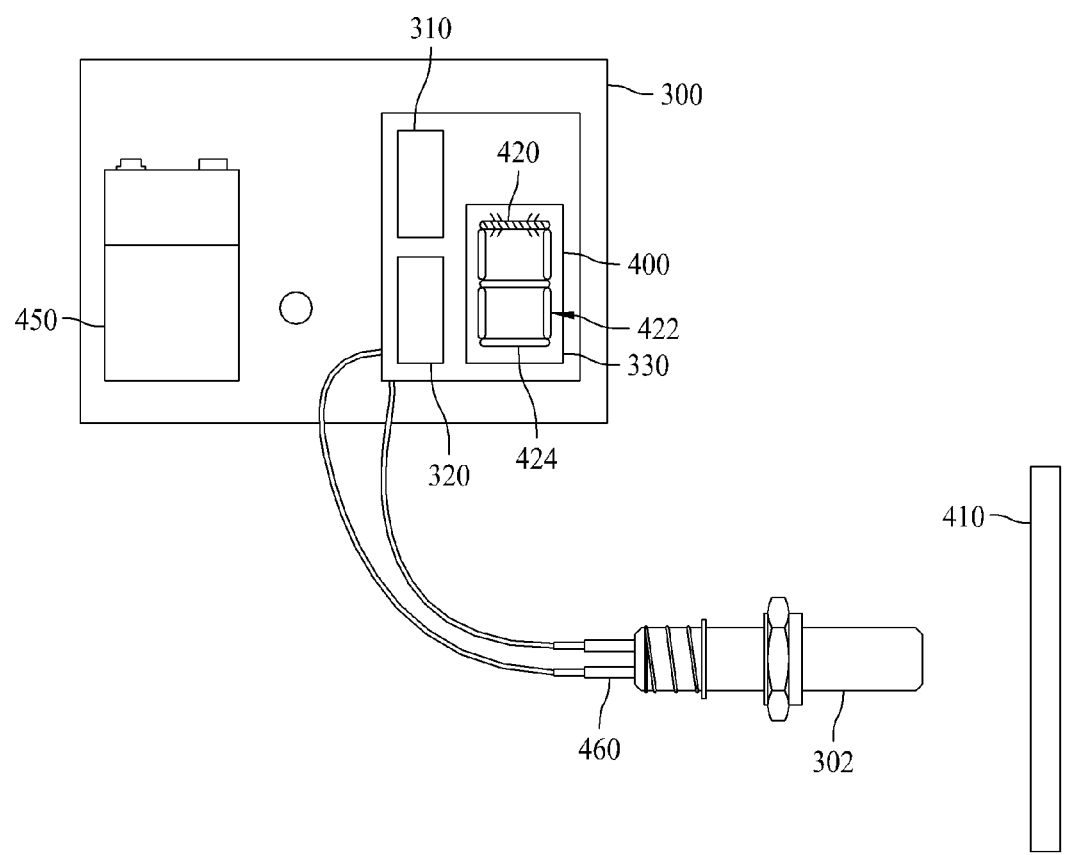
FIG. 4 illustrates an example display on the PSID of FIG. 3 when the proximity sensor is too far from its intended target.

FIG. 4 illustrates an example display 400 on the PSID 300 of FIG. 3 when the proximity sensor 302 is too far from its intended target 410. As seen in FIG. 4, only one "end segment" 420 of the common seven segment display 422 is illustrated as being illuminated, or flashing.

Figure 5:
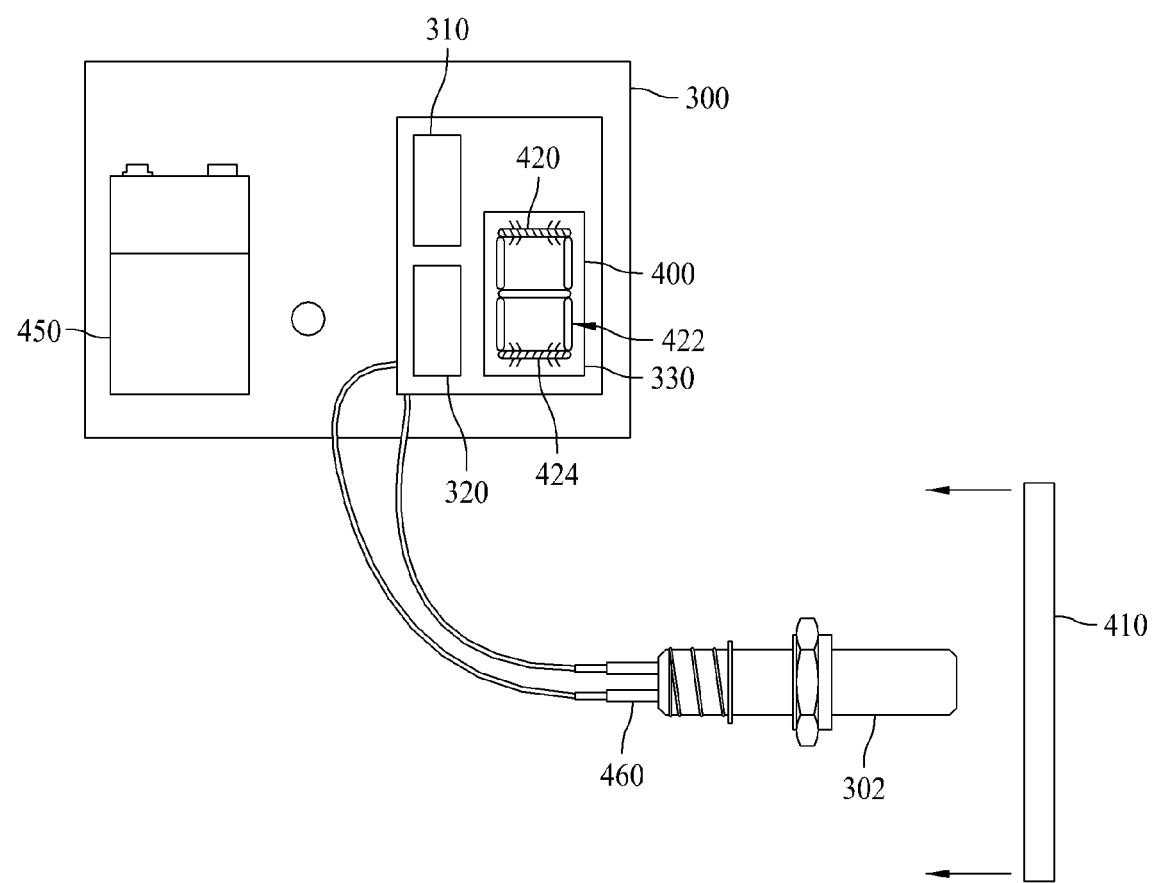
FIG. 5 illustrates an example display on the PSID of FIG. 3 when the proximity sensor is the correct (i.e. nominal) distance from its intended target.

FIG. 5 illustrates the example display 400 on the PSID 300 of FIG. 3 when the proximity sensor 302 is the correct (i.e. nominal) distance from its intended target 410. As seen in FIG. 5, two "end segments" 420 and 424 of the common seven segment display 422 are illustrated as being illuminated, or flashing.

Figure 6:
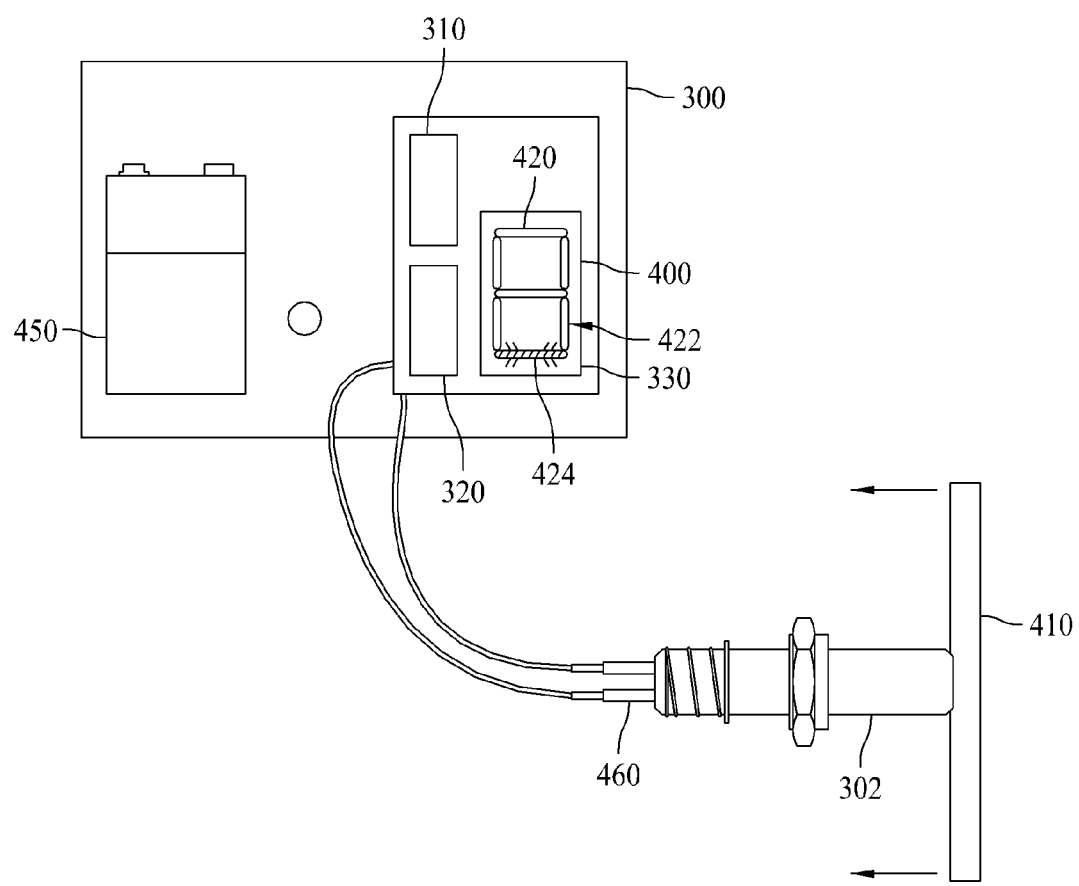
FIG. 6 illustrates an example display on the proximity sensor interface device of FIG. 3 when the proximity sensor is too close to its intended target.

FIG. 6 illustrates an example display 400 on the PSID 300 of FIG. 3 when the proximity sensor 302 is too close to its intended target 410. As seen in FIG. 6, only "end segment" 424 of the common seven segment display 422 is illustrated as being illuminated, or flashing. It is apparent that another type of display might be utilized on tool 300, for example, individual LEDs of the same (or different) colors.

For true portability, at least one embodiment of PSID 300 is intended to run completely stand-alone so a small display on the PSID 300 (e.g., the seven segment display 422) indicates either target near, target nominal, or target far conditions. This indication can be further simplified to sensor Go/NoGo for ease of use. In the aircraft pressure door application referred to herein, PSID 300 easily connects to the sensor 302 and the pressure door (e.g., the target mechanism for sensor 302 in one application) is moved back and forth to verify that the proximity sensors deployed on a pressure access door are properly rigged during door installation. PSID 300 can be calibrated on a test rig which provides a known gap between proximity sensor 302 and a target to ensure proper operation and production readiness.

Referring to the pictorial view of PSID 300 shown in FIGS. 4-6, the major components include the processing device 310, such as a microcontroller also capable of embodying a frequency generator, the seven segment display 422 (illustrated as display 330 in FIG. 3), and a power supply (battery 450). Various embodiments are contemplated. For example, signals utilized to operate the display 330 may be routed to a computer or other type of device capable of providing a distinguishing display along the lines of that described with respect to FIGS. 4-6 and the seven segment display 422. Many visual indicator combinations can be utilized. PSID 300 may also include a connector 460 which provides an easy connect/disconnect mechanism between the PSID 300 and a proximity sensor 302.

Figure 7:
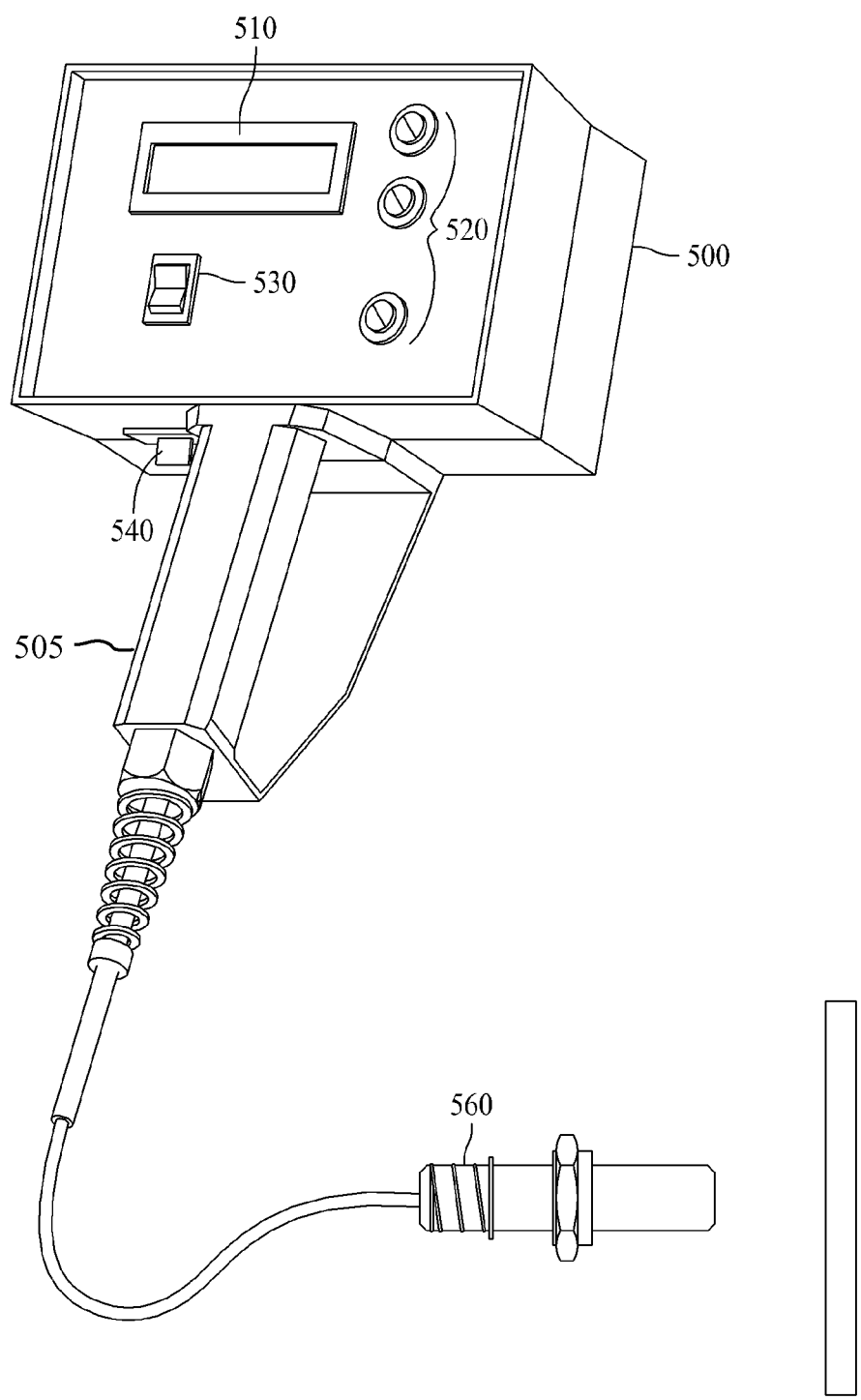
FIG. 7 illustrates an example of a PSID packaged in a hand-held enclosure.

In one embodiment, PSID 300 is packaged in an enclosure 500, an example of which is shown in FIG. 7. Enclosure 500 incorporates a pistol-grip style handle 505 to allow for handheld use of the PSID 300. Enclosure 500 incorporates a display 510, for example, a LCD with back-light option or an LED display. In addition, enclosure 500 is configured to house user-input buttons 520, a power on/off switch 530, a PC connect port 540, an external power source port (not shown), and a sensor connector 560.

Figure 8:
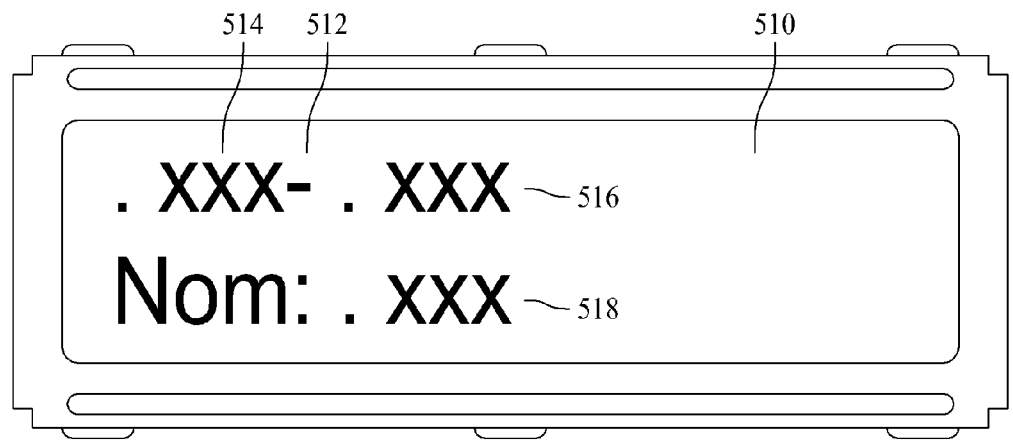
FIG. 8 illustrates an example display on the PSID of FIG. 7 showing a minimum, maximum, and a nominal gap output when the PSID is in a Gap Measurement mode.

FIG. 8 illustrates an example output display 512 on the display 510 of FIG. 7. Output 512 illustrates a gap output as a range between a gap minimum 514 and a gap maximum 516. A nominal gap 518 is also displayed.

Figure 9:
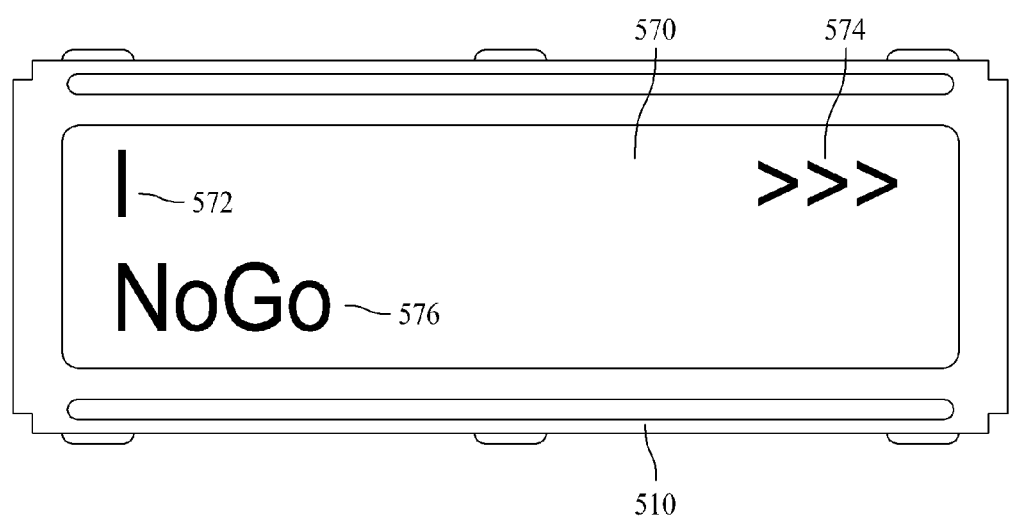
FIG. 9 illustrates an example display on the PSID of FIG. 7 when the PSID is in a Go/NoGo mode and the proximity sensor is too far from its intended target.

FIG. 9 illustrates an example output display 570 on the display 510 of FIG. 7. Output display 570 is displayed when the proximity sensor 302 is too far from its intended target. As seen in FIG. 9, a limit bar 572 is visible on the left side of the output display 570 and the arrow symbol ">>>" 574 is visible on the right side of the output display 570. The "NoGo" legend 576 is also provided on the output display 570.

Figure 10:
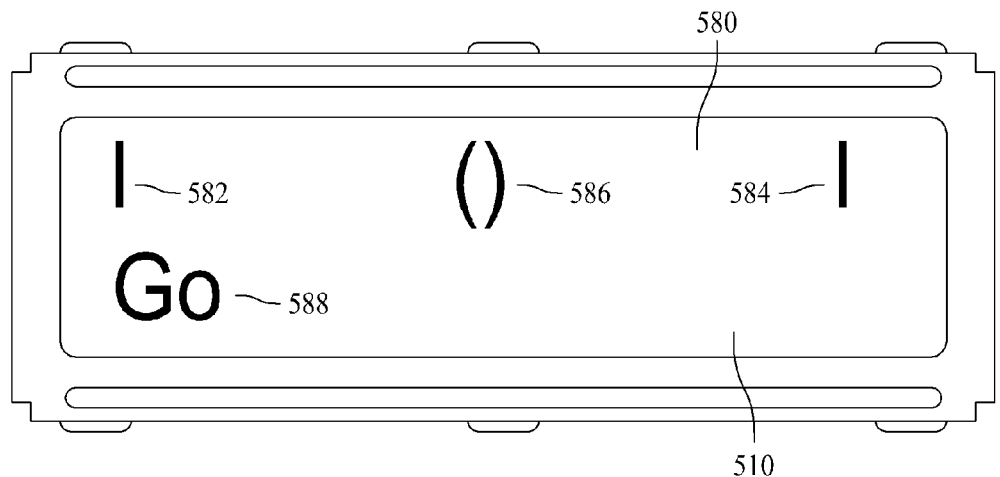
FIG. 10 illustrates an example display on the PSID of FIG. 7 when the PSID is in the Go/NoGo mode and the proximity sensor is the correct (i.e. nominal) distance from its intended target.

FIG. 10 illustrates an example output display 580 on display 510 of FIG. 7. Output display 580 is displayed when the proximity sensor 302 is the correct distance (i.e. nominal distance) from its intended target. As seen in FIG. 10, limit bars 582 and 584 are visible on the left and right side, respectively, of the output display 580 and the "( )" symbol 586 is visible on the center of the display 580 as well as the "Go" legend 588.

Figure 11:
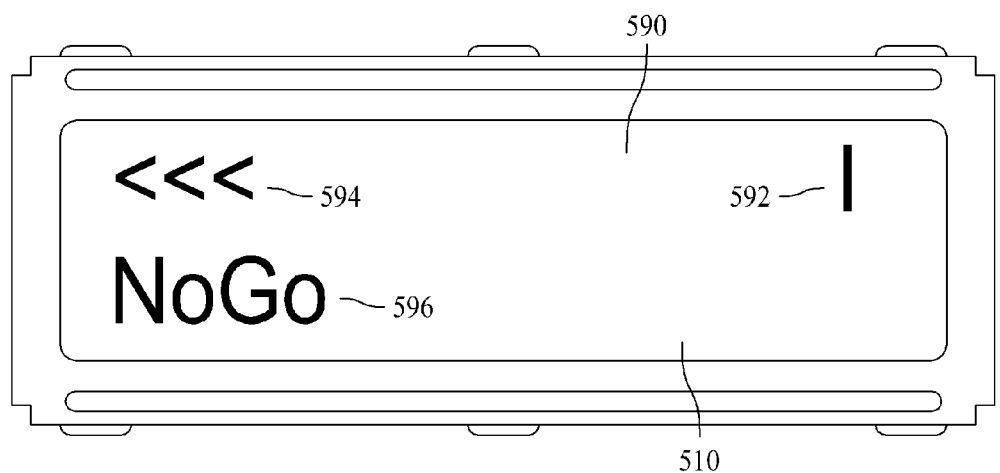
FIG. 11 illustrates an example LCD display on the PSID of FIG. 7 when the PSID is in the Go/NoGo mode and the proximity sensor is too close to its intended target.

FIG. 11 illustrates an example output display 590 on display 510 of FIG. 7. Output display 590 is displayed when the proximity sensor 302 is too close to its intended target. As seen in FIG. 11, a limit bar 592 is visible on the right side of the output display 590 and the arrow symbol "<<<" 594 is visible on the left side of the output display 590. The "NoGo" legend 596 is also provided on the output display 570.

In summary, the PSID 300 described herein is a portable, hand-held, self-powered, proximity sensor rigging device that allows for electronic rigging of, for example, aircraft pressurized door sensors. The capability to electronically rig these sensors is in lieu of mechanical sensor rigging. The PSID 300 connects directly to a proximity sensor that is installed on an aircraft, for example, and is able to both drive and interrogate a proximity sensor.

When PSID 300 is connected to a proximity sensor 302, and a metal target is moved back and forth across the sensor face, a signal is generated that manifests itself as a quantifiable and repeatable output to a display or secondary processing device.

In one type of application, PSID 300 may be utilized by airlines and major overhaul facilities that service aircraft in the event that they need to install replacement sensors and subsequently rig them to specification. Cost savings through utilization of PSID 300 is found due to reduced time in the shop to install and rig the doors. Additional cost savings is achieved in that the door installation procedure can be completed earlier and in one job since no aircraft power is required to use PSID 300 when rigging the sensor.

In one embodiment, PSID 300 is calibrated using a single-axis motion table with a micrometer to set a known gap between the proximity sensor 302 and the target 410, for capturing the RC-decay output. These RC-decay values are then stored for that particular sensor/target configuration within processing device 320. Embodiments are contemplated where a processing device is configured to store RC-decay values for different proximity sensor/target combinations, the RC-decay values for each sensor/target configuration determined using similar calibrations steps. Certain embodiments of proximity sensor and targets may require a different RC circuit with different values for one or more of the resistor 396 and capacitor 398. As such, switching may be incorporated into PSID 300 to allow for testing with different RC combinations and/or testing with multiple RC-decay values stored within PSID 300.

The above defines a method for calibrating PSID 300. Specifically, a metal target is moved towards a face of a proximity sensor that is fixed in position until the target and sensor face establish contact, the metal target is then moved away from the face of the proximity sensor to a prescribed gap distance. PSID 300 is then operated to obtain an output value, thereby defining a relationship between gap distance and the output value that can be tabulated within a look up table in the processing device. The steps can be repeated to generate additional gap distance to output values for storage within the look up table.

A set of engineering requirements have been developed to establish a baseline for the PSID 300. The primary requirements are the critical requirements used to determine the gap measurement capability of the PSID 300 with respect to accuracy, precision, and resolution. The additional requirements are non-critical requirements used to better understand other factors that may affect the operation of the PSID and establish preliminary recommendations on how to compensate for these effects. The additional requirements also encompass a controls interface and packaging for the PSID to address issues such as ergonomics and human factors for test instrumentation.

The primary requirements propose a target range of 0.060±0.040 inches (0.020-0.100 inches) to conform to the current access door rigging requirements. Within this range, door crew mechanics have requested that the prototype output a gap measurement in distance (inch) units. As such, current embodiments of the PSID 300 have been programmed to correlate the output value in time (millisecond) units to distance (inch) units via an appropriate transfer function. After correlations were established, the PSID was tested to determine its accuracy, precision, and resolution.

Figure 12:
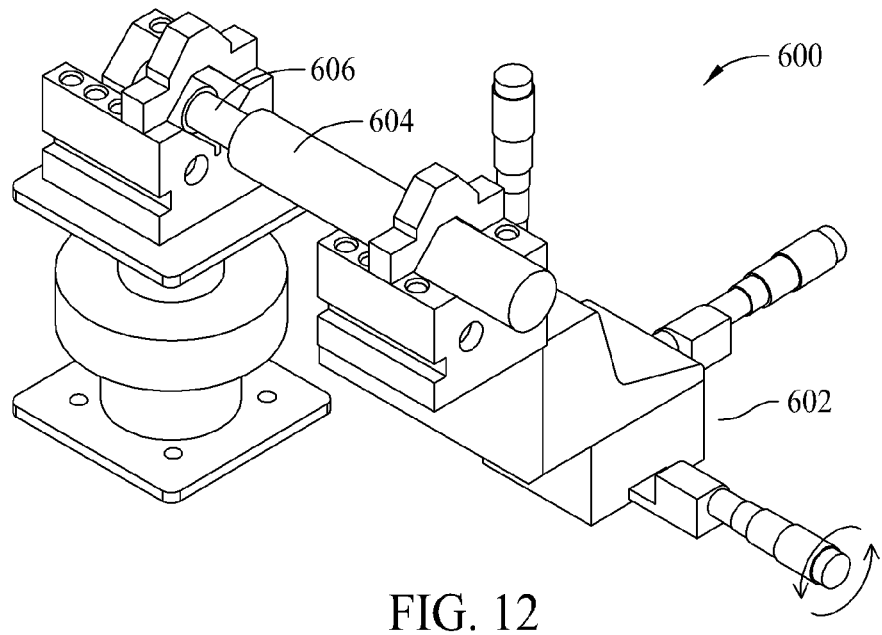
FIG. 12 is a depiction of a Phase I test rig where a position of a target can be adjusted with respect to a position of a sensor.
Figure 13:
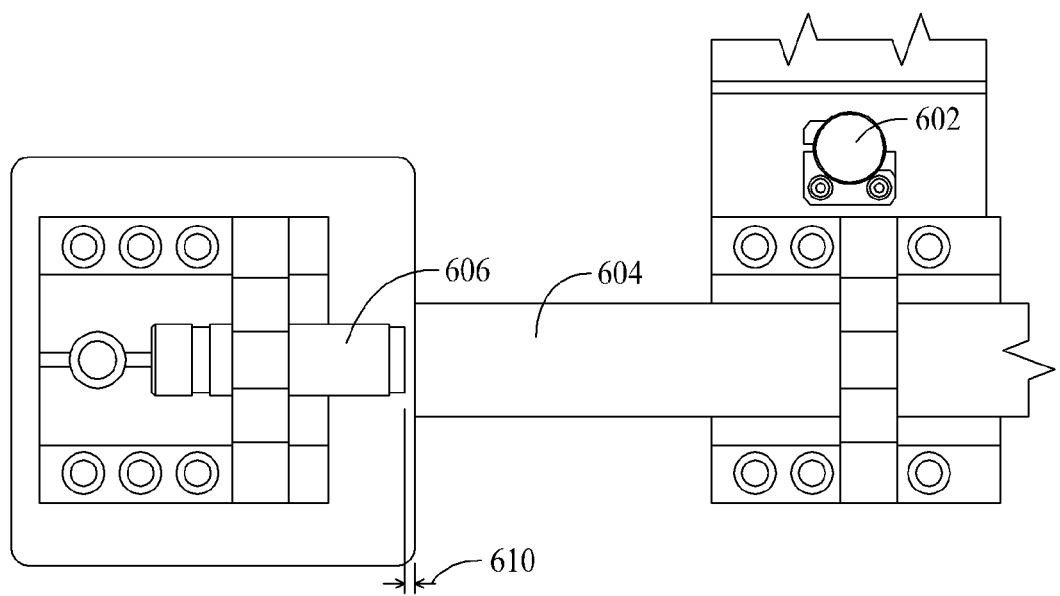
FIG. 13 illustrates a gap between the target and the sensor of FIG. 12.

Testing of the PSID 300 has been conducted in two separate phases. Phase I testing established the repeatability of the prototype and determined if the methodology was adequate for gap measurement. Phase I testing also incorporated optimization studies to improve the sensitivity of the PSID 300 to establish the best possible resolution for measurement. FIG. 12 is a depiction of the Phase I test rig 600 and includes X-Y-Z linear motion axis tables 602 to adjust a position of the target 604 with respect to the sensor 606. FIG. 13 provides a detail view of the gap 610 between the sensor 606 and the target 604.

Phase I testing also established the correlation between time and distance output to allow the PSID to output the gap measurement in distance (inch) units. In order to minimize variability and ensure a standard for actual gap, a round target (target 604) was machined for use in the Phase I test rig 600 in a pure head-on configuration. The target 604 included was slightly larger than the face of sensor 606 to present to the sensor 606 as large surface area as possible to standardize the test rig output and minimize signal loss. The test rig 600 was fabricated using an x-y-z and rotary table 602 to establish the 5 degrees of freedom required to establish all of the test parameters. For Phase I, the face of target 604 was centered about the axis of the sensor 606 and set parallel to the sensor face. During testing, the target 604 was moved away from the sensor 606 using one of the linear positioning tables to set the gaps. Phase I testing was successful as the PSID 300 was shown to be adequately repeatable and reliable in sensor gap output.

Figure 14:
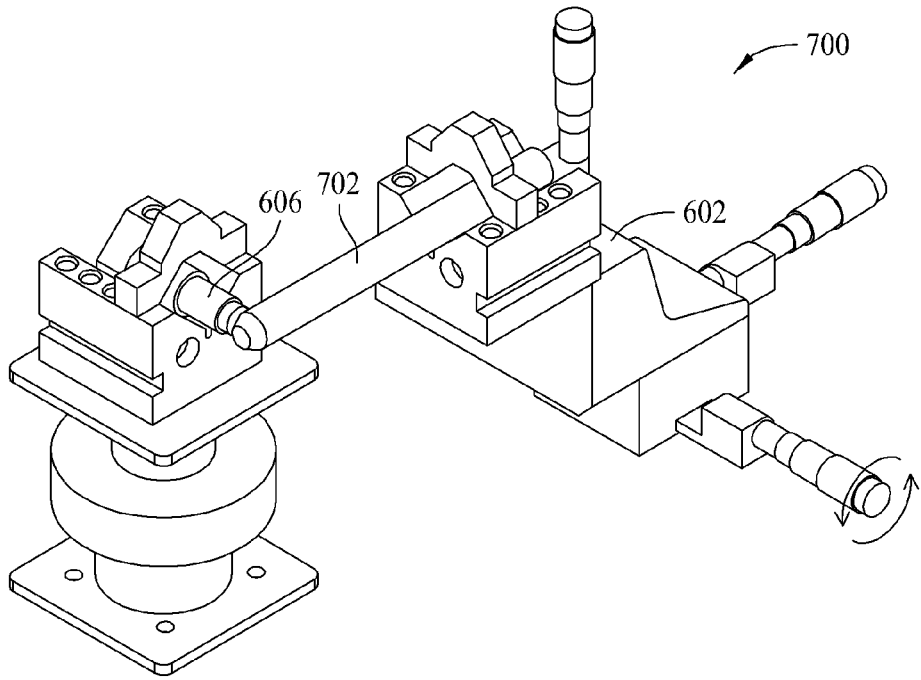
FIG. 14 is a depiction of a Phase II test rig where a position of a latch pin target can be adjusted with respect to a position of a sensor.
Figure 15:
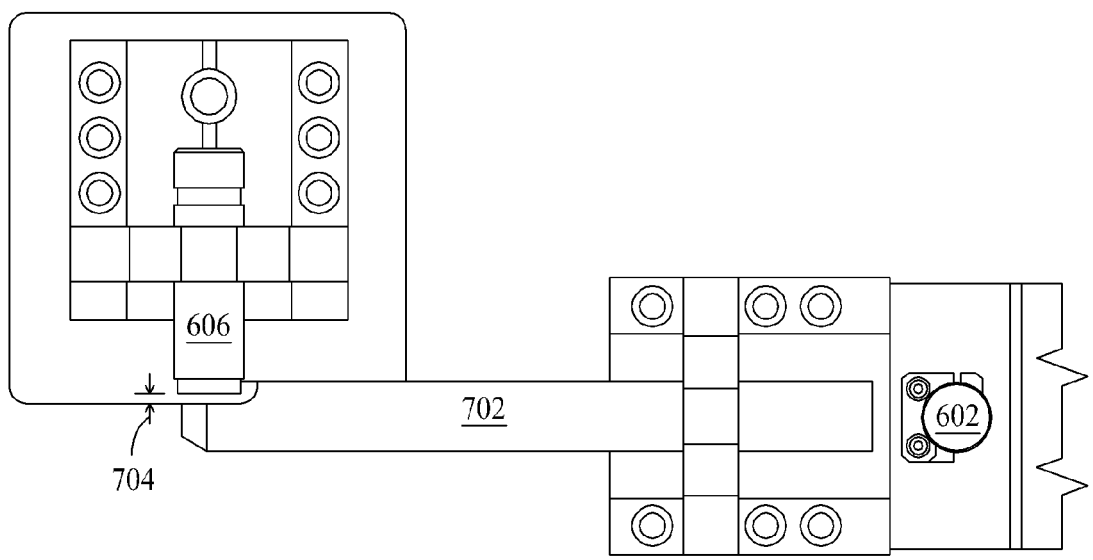
FIG. 15 illustrates a gap between the latch pin target and the sensor of FIG. 14.

Phase II testing calibrated the PSID 300 using a test rig 700, as shown in FIG. 14, that incorporated a mock-up of a latch pin 702 as a target for the sensor 606. The mocked-up latch pin 702 is similar to one of the latch pins currently utilized on the 787 aircraft. To capture the variability presented by mechanical tolerance in the composite material stack-ups of the door and surrounding components, Phase II testing utilized two separate configurations to fully establish a sensor response envelope. FIG. 15 is a detail view of the sensor 606 and the latch pin mock-up 702 providing a view of the gap 704 between the sensor 606 and latch pin 702.

In the first configuration, an "aligned" configuration was utilized with only the gap as a variable. Such configuration established a high response curve, or the "best-case" that a particular installation should ever see. In the second configuration, a full tolerance stack-up misalignment was used to establish the low response curve, or the "worst-case" that a particular installation should ever see. This phenomenon is referred to as the "perceived gap" sensed by the proximity sensor because it cannot be determined beforehand what the actual build configuration will be. The true gap will be somewhere within the bounded area defined by the high response and low response curves.

Due to the large cantilever moment arm inherent in this test configuration, one of the challenges that arose was zeroing the test rig. Particularly, it was difficult to determine when the target contacted the sensor face, and therefore it was easy to over-run true zero and impart a pre-load on the sensor/target interface. Overrunning of true zero skews the test results because the initial gap settings would still be zero as the target is moved away from the sensor and this interference is being relaxed. To solve this problem, a zeroing procedure was developed such that an arbitrary gap of 0.002 inch was used with a corresponding 0.002 inch feeler gauge to establish a zero gap.

The micrometer was first set to 0.002 inch and the sensor was loosened in the test rig 700. A 0.002 inch feeler gage was then inserted into the gap and the sensor 606 was pushed forward until it just retained the feeler gage. With touch-feel, the feeler gage should just lightly catch within the gap and offer slight resistance when it is pulled out. When this is satisfied, the sensor 606 is then locked in place taking care not to impart too much torque on the clamp holding the sensor 606 in place. Finally, the micrometer of the test rig 700 is set back to zero to establish the zero gap condition.

RC Circuit Optimization

To optimize the RC circuit (320 in FIG. 3) the ideal RC constant (ratio of Resistance to Capacitance) for circuit implementation had to be determined as well as a frequency at which to pulse the RC circuit 320 of the PSID 300. In general, a sine wave voltage pulse (VSIN) from the microcontroller (processing device 310) will charges the capacitor 398, whose charge will decay at a set rate based on this ratio (RCTIME: $\tau = R \times C$). The first consideration was to choose a RC combination that would allow the capacitor 398 to fully charge quickly, but whose charge would decay at a rate adequate enough to capture a useful RCTIME value. Due to inherent system error, RCTIME needs to be captured and calculated multiple times as the inductive sensor 302 varies the rate of the current discharged by the capacitor 398 when the VSIN pulse is turned off. These values are averaged to provide a basic form of signal noise processing and output a single RCTIME value.

Figure 16:
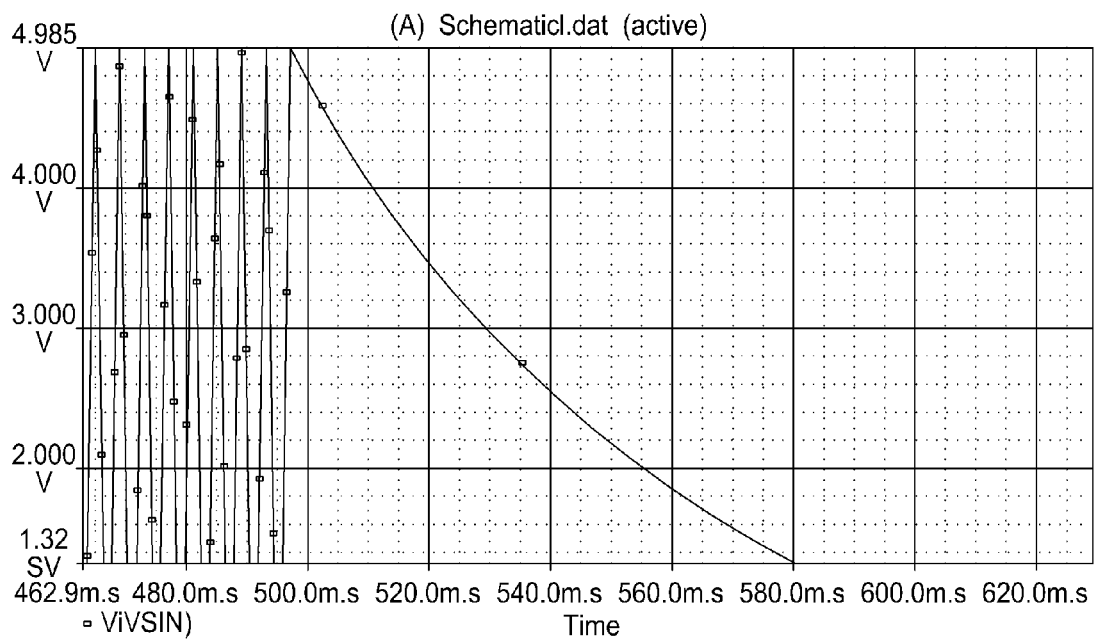
FIG. 16 is a graph illustrating the simulation of an RC circuit to characterize a response of the proximity sensor interface device.

The RC circuit 320 was simulated to characterize the response of PSID, as shown in FIG. 16. This became very useful when choosing the frequency and VSIN pulse cut-off time. When selecting the frequency, it is important to note the time that the pulse will be cut-off (from which point RCTIME will be measured). In essence, the alternating current (AC) will repeatedly 'pull-up' and 'pull-down' the charge of the capacitor 398. As such, frequency and pulse time values are chosen so that the pulse is stopped and the micro-controller 310 immediately starts to calculate RCTIME when the voltage is at its highest possible value. As can be seen in FIG. 16, since the voltage rises and falls rapidly, choosing a frequency cut-off time that does not correspond to the peak voltage may result in no response, due to the voltage already being at a level too low for a usable RCTIME value to be calculated.

Figure 17:
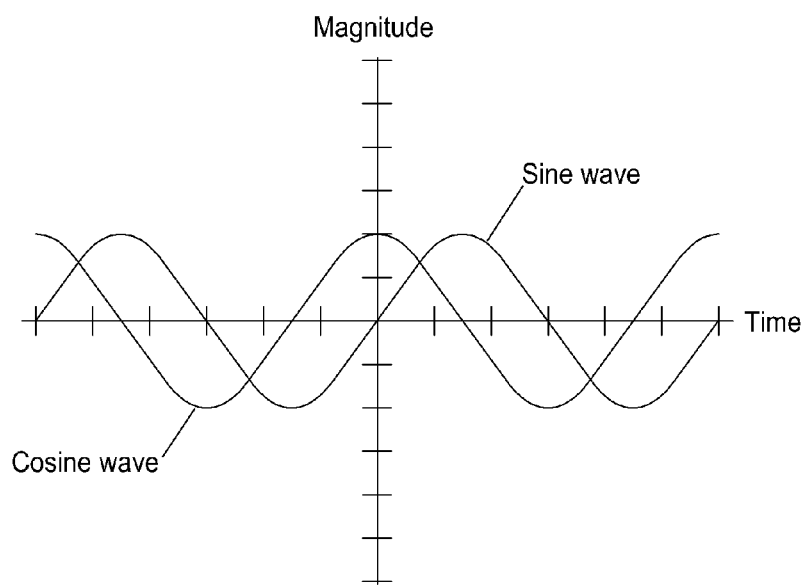
FIG. 17 illustrates a phase shift caused by one microcontroller utilized to process inputs received from the sensor in the PSID.

In one embodiment, the micro-controller used for processing device 310 starts its pulse with a voltage high which results in a 90 degree left phase shift in our VSIN pulse, thereby resembling a cosine curve as shown in FIG. 17. Not accounting for this may result in choosing a pulse cut-off time that results in a voltage that has not peaked which could lead to a very small or zero response for RCTIME.

Phase I testing incorporated adjustments of RC values and obtaining of RCTIMES for both zero gap and full open (infinite) gap conditions. The optimizing criterion was the largest RCTIME delta between zero and infinite gap but the smallest standard deviation (cleanest data) for RCTIME captures. A large delta was desired because this results in a finer resolution between gap values and allows the prototype to operate like a micrometer. Particularly, starting with a 10 Kilo-ohm resistance and a 0.1 microFarad capacitance, the resistance was modified using an RC decade box until a resistance value was found that met the criteria specified above. In general, the results illustrated that, the higher the resistance, the larger the RCTIME delta. However, it was also observed that a larger RCTIME delta resulted in a larger standard deviation so a trade-off was necessary to achieve an optimized point.

These steps were repeated until an optimized point was determined that balanced the Min/Max RCTIME delta against the standard deviation for that particular RC configuration. When this optimized point was found, the appropriate resistor/capacitor components were then hard-wired into the board to lock down the RC circuit for subsequent testing. Based on the optimization study, the optimized RC constant values for this prototype configuration were found to be R=65 Kilo-ohm and C=0.1 microFarad.

In certain embodiments, an averaging algorithm is utilized to stabilize the output at each measured gap distance. For example, the PSID 300 was operated to collect multiple RCTIMES at each measured gap distance and the average of these values was calculated. A single average RCTIME value, instead of multiple raw RCTIME values, was found to reduce variance introduced by minute differences in the timing of each pulse and each calculation of RCTIME. In general, the more data points taken for the average, the more stable the output value.

Data Analysis

The testing procedure for the PSID 300 consisted of setting a target at a prescribed gap distance, angle, and vertical offset from the sensor and collecting RCTIME values for that gap. This data generated a gap vs. RCTIME curve that was used to establish the correlation between gap and RCTIME. In operation, the PSID operates to output gap values (in inches) based on the RCTIME measured. Analysis has shown that the gap measurement capability is repeatable and reliable to requirements that allow the device to be usable by aircraft mechanics in the field.

To properly analyze the raw data, it was re-organized and sorted such that RCTIME becomes the independent variable and gap becomes the dependent variable. The reason for this is that a correlation has to be established between RCTIME and gap so that the prototype can output a proper gap in distance (inch) units. After the data was sorted by RCTIME, a T-Test was conducted, along with good engineering judgment, to identify and remove data outliers.

Figure 18:
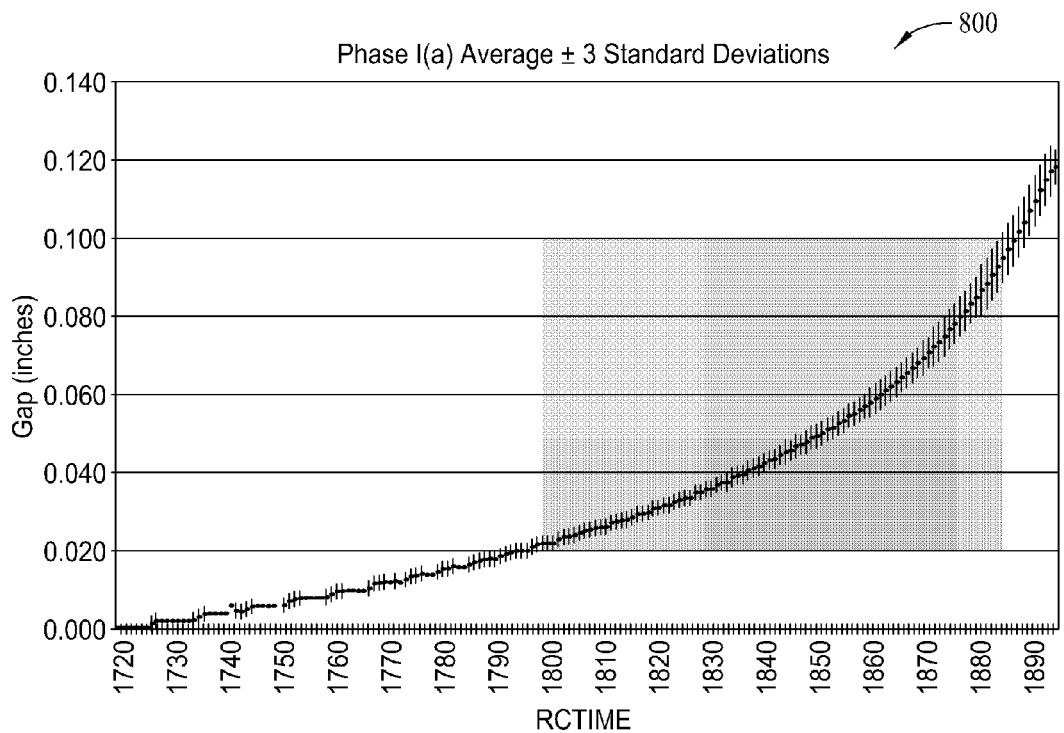
FIG. 18 is a graph plotting the RC time of the RC circuit against the gap between the target and sensor using the Phase I test rig.

After these outlier data points were removed, the data gathered from Phase I(a) was graphed and is shown in the plot 800 of FIG. 18. Phase I(a)'s primary objective was to verify that the prototype was repeatable and reliable. For this phase, the test rig was set up with the target surface parallel to the sensor face and the target providing complete coverage of the sensor. This configuration had no angular misalignment and no vertical offset. The only variable was the gap. This is the equivalent of a "best-case" (high response) scenario with no manufacturing tolerances taken into consideration. For this, and all subsequent testing, the data was analyzed to ±3 standard deviations, which provides a 99.7% confidence level that the actual gap is within the sensor response envelope.

Still referring to FIG. 18, the data for plot 800 was obtained from 117 total test runs with data gathered at 0.002 inch increments from 0.000 inch to 0.120 inches. The highlighted area 802 on the plot 800 represents the effective range of the PSID 300, that is, the gap range that would be seen by a mechanic on a typical sensor rigging installation. As shown, the standard deviations are very small compared to the gap, indicating that the data collected was very repeatable and reliable.

Plot 800 also illustrates how the PSID 300 reports the gap. In the field, the PSID 300 would measure an RCTIME value based on the perceived gap of a sensor installation. This RCTIME value is traced vertically until it intersects the sensor response curve and then horizontally to obtain the gap. For example, an RCTIME of 1860 indicates a gap of 0.057 inch with a standard deviation of 0.001 inch. Therefore, the gap is 0.057±0.001 inches.

It is important to note that there is a considerable power draw when a back-lit LCD is incorporated into the PSID 300 and turned on. The power source should be able to maintain this power requirement to ensure stable and proper operation of the PSID. To ensure stable power in laboratory testing, the PSID was outfitted with a power supply that was able to regulate the input current to the device to minimize power quality as a source of error in the data.

The next stage of testing involved using a production-style target, used to simulate the actual conditions that are found in an aircraft installation environment. Phase II(a) used a representative (bayonet-style) latch pin target in a straight on configuration, where tolerances and rigging do not cause any angular misalignment or vertical offset. Such a configuration should yield a "high-response" curve due to the close proximity of the sensor/target components and the sensor's inductive characteristics. Phase II(b) used this same representative target, but incorporated the maximum "worst-case" angular misalignment and vertical offset that are specified by the engineering design and rigging requirements. This configuration should yield a "low-response" curve due to the higher gap of the sensor/target components and the sensor's inductive characteristics.

Because the inductive sensor will output substantially different values for these two different configurations, it was crucial that both curves were well characterized to give two sensor response bounding curves that envelop the gap the sensor could be detecting (perceived gap). These two curves will define the sensor response envelope for that particular sensor/target configuration.

Figure 19:
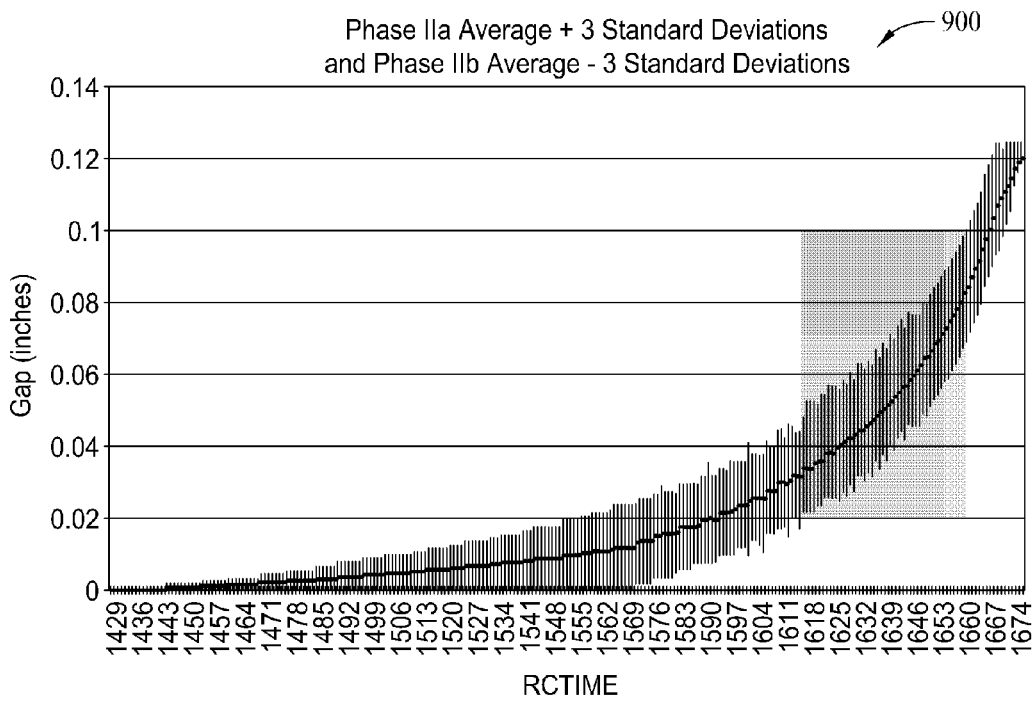
FIG. 19 is a graph plotting the RC time of the RC circuit against the gap between the latch pin target and sensor using the Phase II test rig.

Results from Phase II(a) and Phase II(b) testing are shown in the graph 900 of FIG. 19. Note that the range shown for each RCTIME value is bound by the upper curve, which is the "best-case" scenario plus 3σ standard deviations for each RCTIME value, and the lower curve, which is the "worst-case" scenario minus 3σ standard deviations for each RCTIME value. This range ensures that there is approximately a 99.7% confidence level that the actual gap being measured falls within the Gap Min/Gap Max values reported by the prototype PSID.

As graph 900 shows, a good range of usable RCTIME outputs corresponding to a typical sensor installation range of gap values is provided. For instance, at RCTIME 1640, this data indicates the true value of the gap is between 0.039 and 0.068 inches. Therefore, with this RCTIME output measured, the PSID will report a perceived gap range of Gap Min=0.039, Gap Max=0.068, Gap Nom=0.054 or approximately 0.054±0.015 inches. The confidence level is 99.7% that the actual gap lies somewhere between this reported gap range. The nominal gap shown above is simply an arithmetic average of Gap Min and Gap Max. In actuality, the actual gap is most likely closer to the high response curve due to the nature of the detail part tolerances and installation. The parts are most likely not all out to the worst case end of the tolerance spectrum but somewhere within a statistical RSS bandwidth so the perceived gap is probably a bit closer to the actual gap.

It is important to note that good shielding should be incorporated into the design to minimize interference that may be introduced by external electronic sources. In the event that interference cannot be shielded against, an option would be to change the PSID's output frequency to try to bring the output above the noise and stabilize the data.

For each proximity sensor placement that will be measured with the PSID 300, it is necessary to calibrate the device to capture the sensor response envelope for that particular sensor, thereby defining prescribed tolerances for the particular sensor ensuring a relative position of the proximity sensor and target device are within the prescribed tolerances, based on the discharge time. The sensor response envelope for a proximity sensor is the area bound by the two curves described herein, the high response curve and the low response curve.

As described above, the "high response" refers to the inductance of the proximity sensor as a target, positioned in front of the sensor face, and moved away in discreet gap increments to determine how the inductance changes per gap distance. In this condition, the target is positioned straight-on with the sensor with no angular/vertical misalignment. As such, this sensor response should yield the highest inductance that the proximity sensor is ever going to physically sense, assuming that all manufacturing tolerances are within acceptable range.

The "low response" refers to the inductance of the proximity sensor as the target, positioned in front of the sensor face, and moved away in discreet gap increments to determine how the inductance changes per gap distance. In this condition, the target is positioned with worst-case angular/vertical misalignment (determined by a tolerance stack-up analysis on the installation). As such, this sensor response should yield the lowest inductance that the proximity sensor is ever going to physically sense, again assuming that all manufacturing tolerances are within acceptable range.

As described above with respect to FIGS. 14 and 15, a door latch-pin target is clamped and positioned relative to a corresponding proximity sensor. A linear motion table is used to set the various gaps required to adequately capture a sensor response curve. The baseline gap increments that were used to capture the prototype calibration data points were from 0.000 to 0.120 inches in 0.002 inch increments to adequately cover the rigging requirement range (0.020-0.100 inches).

With this set-up, the steps to define a calibration process for a sensor/target installation are outlined below. The test rig includes a representative production sensor and target. The PSID captures the output in raw RC time decay value, and a math processor is used to perform the data analysis/curve fitting calculations. The calibration process includes configuring the test rig for high-response, set the gaps and measure/record RCTIME values for each gap. The test rig is then configured for low-response, the gaps are set, and RCTIME values for each gap are measured and recorded. The process is "reversed" where the RCTIME values are the independent (x-axis) variable and gap is the dependent (y-axis) variable. For each applicable RCTIME value, calculate the average gap and standard deviation from the above calibration data points and multiply the standard deviation by 3 to get 3σ standard deviations, allowing for the 99.7% confidence level in the resultant sensor response envelope. The following two curves can then be calculated:

High Response Curve=High Response Gap Averages+ 3σ Standard Deviation

Low Response Curve=Low Response Gap Averages− 3σ Standard Deviation

On each of these curves, apply curve-fitting (e.g. −6$^{th}$ Order Polynomial Curve-Fit Approximation) to derive a curve-fit equation for these curves of the form y=$Ax^6+Bx^5+Cx^4+Dx^3+Ex^2+Fx+G$, where x=RC time decay (milliseconds), y=calculated gap (inches), and A, B, C, D, E, F, G are coefficients.

Loading the Calibration Data into the PSID

In one embodiment, a low-cost micro-controller may be used that does not have an extensive on-board math co-processor. In this embodiment, the curve-fit approximations may be performed on an external processor, such as a PC, using appropriate spreadsheet and/or math software. After the above calibration data points are calculated, the following steps outline the procedure to load these points into the PSID: load the high response curve into the device as explicit data calibration points comprised of the average gap +3σ standard deviations, and load the low response curve into the device as explicit data calibration points comprised of the average gap −3σ standard deviations.

The calculated gap values are loaded into address locations that are set equal to the RCTIME value that was measured for that particular gap. For example, if an actual gap of 0.002 inch resulted in an RCTIME output of 1730, then the address to store this gap value on the device would be set to "1730". Therefore, the micro-controller needs only to pass in the RCTIME value and the returned value will be the corresponding gap. For the second curve, to avoid data overlap, the values are stored in address registers offset by some fixed value. The micro-controller adds this fixed value to the RCTIME value and sets that as the address register prior to storing the corresponding gap value.

Due to the resolution of the device, many RCTIME values are stored in EEPROM. Manually entering them into the PSID would be a time consuming process. Therefore, an automated process can be used to automatically enter large amounts of calibration data points into the PSID. Various software with communications protocols can be used to achieve data transfer via the PSID's PC connect port 540.

Initial embodiments of the PSID used a look-up table process that requires a significant amount of memory to hold all of the calibration data points but not too much computational power. Improved PSID embodiments require very little memory to hold the equation coefficients but a lot of computational power to calculate the gap. As such, some embodiments incorporate a math co-processor or equivalent, and the above described calibration steps become: the coefficients derived from the curve fit are then loaded into the device for that particular sensor/target configuration. With the coefficients loaded into the device, the micro-controller can then calculate the gap for every RCTIME decay value measured using the curve-fit equation and then output the gap accordingly.

Correlate RCTIME to Gap Values

Transparent to the user, the device must correlate the RCTIME (RC circuit decay time) value measured (in milliseconds) to Gap values (in inches) to report out the proper perceived gap range. As a basic form of signal conditioning, when the device pulses the sensor it actually pulses it multiple times (the number of pulses is dependent on the variable size the micro-controller is able to handle without overflowing) and takes an average of these values to yield a single RCTIME averaged value. This value is then further processed to obtain the corresponding gap value.

The RCTIME decay average is calculated and then input into a search algorithm to search the High-Response/Low-Response look-up tables for the respective Gap Max and Gap Min values. These values are pulled and then reported. Note that some addresses in the table may be "blank" with no gap data. In one embodiment, these blank addresses were filled with an arbitrary fixed value to serve as a check variable. When the search algorithm detects this check variable, it is prompted to skip to the next address to try to find the closest gap value. Again, because the equations were derived with ±3σ standard deviations, the measurement has a 99.7% confidence level that the actual physical gap is somewhere within this perceived gap range.

In the improved embodiments described herein, the RCTIME average is calculated and then input into the High Response/Low Response equations (with their respective coefficients) and the Gap Max and Gap Min values are calculated and reported out. Again, because the equations were derived with ±3σ standard deviations, the measurement has a 99.7% confidence level that the actual physical gap is somewhere within this perceived gap range values.

An important consideration in selecting a micro-controller is variable memory management, for example, ensuring that the micro-controller has adequate capacity to store all data captured and processed by the controller. Also the variable memory management for the micro-controller should include a proper protocol for handling overflow errors. Ideally, an overflow error should result in program termination and error reporting. Note all variable memory management algorithms do this, however. Some will simply loop back to zero or truncate the variable and continue with a smaller value. These conditions should either be avoided or have robust check codes incorporated to ensure that the micro-controller outputs proper values.

Operation

Operation of the PSID, assuming that it is fully calibrated as outlined above, includes removing the system connector (if attached) from the sensor to be inspected. The PSID's interface connector to the sensor is then installed. Power is applied to the PSID, and it initializes. The appropriate sensor is then selected from the menu. Close and properly latch the door, turning the handle until the latch pins are fully engaged and press the "Pulse Sensor" button to take a gap reading. Record the gap reading (range) and determine if the installation rig is "Good/No Good". Repeat the gap measurement 3 times as is necessary to ensure stable gap readings. Turn off the PSID, remove the interface connector, and re-install the aircraft system wire connector (if available).

If the PSID has the "Auto-Zero" feature incorporated, the following steps are run prior to the closing and latching of the door: At the user prompt, fully install and cover the sensor face with the High Response Slug and press the "Pulse Sensor" button to capture this data point. At the user prompt, fully install and cover the sensor face with the Low Response Slug and press the "Pulse Sensor" button to capture this data point. At the user prompt, fully remove all slugs, ensure the sensor is full "open", and press the "Pulse Sensor" button to capture this data point. These data points are now stored in the device to be used in the "Auto-Zero" algorithm to properly adjust the gap values. This "Auto-Zero" feature is used to compensate for variation from sensor-to-sensor due to manufacturing and other inherent tolerances.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A proximity sensor interface device (PSID) for determining if a proximity sensor is in an acceptable position with respect to a target device, said PSID comprising:
   a frequency generator;
   a processing device;
   a memory associated with said processing device, wherein said memory comprises a sensor response envelope stored therein comprising:
     a high response curve defined by inductance changes in the proximity sensor at discrete gap increments between the target and the sensor, with no angular or vertical misalignment between the target and the sensor; and
     a low response curve defined by inductance changes in the proximity sensor at discrete gap increments between the target and the sensor, with a worst case angular or vertical misalignment between the target and the sensor;
   a display;
   an RC circuit, said processing device programmed to route a signal generated by said frequency generator through the proximity sensor and said RC circuit for a prescribed period of time, said processing device programmed to measure a discharge time of said RC circuit, said processing device programmed to determine whether a response of the proximity sensor satisfies a threshold associated with the high response curve and the low response curve, said processing device further programmed to cause said display to provide an indication of whether a relative position of the proximity sensor and target device are within prescribed tolerances, based on the discharge time; and an enclosure housing said frequency generator, said processing device, said memory, and said RC circuit, said enclosure including a handle and configured for hand-held use.

2. The PSID according to claim 1 wherein said memory comprises a sensor response envelope stored therein, said sensor response envelope defined for at least one specific proximity sensor.

3. The PSID according to claim 1 wherein the high response curve is calculated as the high response gap averages +3σ standard deviations, the low response curve is calculated as the low response gap averages −3σ standard deviations, and on each of these curves, a curve-fitting approximation is applied to derive a curve-fit equation for the curves of the form $y=Ax^6+Bx^5+Cx^4+Dx^3+Ex^2+Fx+G$, where x=RC time decay, y=calculated gap, and A, B, C, D, E, F, G are coefficients.

4. The PSID according to claim 1 wherein said processing device is programmed to cause said display to provide the indication in inch units, said programmable device programmed to correlate the discharge time with a distance between the sensor and the target.

5. The PSID according to claim 1 wherein said processing device is programmed to cause said display to provide the indication as a Go/No-Go indication, said programmable device programmed to correlate the discharge time with a distance between the sensor and the target, and determine whether the correlated distance is within a defined tolerance.

6. The PSID according to claim 5 wherein the Go/No-Go indication on said display comprises a visual tool to indicate gap measurement between two limit bars that indicate a minimum gap requirement and a maximum gap requirement, respectively, as defined by a specific sensor and target installation.

7. The PSID according to claim 1 wherein said processing device comprises at least one of said frequency generator and said memory.

8. The PSID according to claim 1 wherein said processing device is programmed to:
measure a discharge time of said RC circuit multiple times; and
average the measured discharge times to determine a single discharge time.

9. The PSID according to claim 1 wherein said RC circuit comprises a resistor and a capacitor forming an RC combination, the resistance and capacitance chosen such that said capacitor is configured to charge quickly but have an adequate decay such that a useable discharge time results.

10. The PSID according to claim 1 further comprising an interface for connecting to deployed proximity sensors.

11. A method for determining if a proximity sensor is in an acceptable position with respect to a target mechanism, said method comprising:
applying a signal of known frequency to the proximity sensor and a RC circuit electrically coupled to the proximity sensor for a prescribed period of time;
measuring the discharge time of the RC circuit with a processing device;
determining, by the processing device, whether a proximity sensor response satisfies a threshold associated with a sensor response envelope including a high response curve defined by inductance changes in the proximity sensor at discrete gap increments between the target and the sensor, with no angular or vertical misalignment between the target and the sensor, and a low response curve defined by inductance changes in the proximity sensor at discrete gap increments between the target and the sensor, with a worst case angular or vertical misalignment between the target and the sensor; and
providing, on a proximity sensor interface device (PSID) including a handle and configured for hand-held use, a display indicative of whether the relative position of the proximity sensor and the target device are within prescribed tolerances, based on the discharge time.

12. A method according to claim 11 wherein measuring the discharge time of the RC circuit comprises measuring a discharge time that varies based on a relative positioning and distance between the proximity sensor and the target mechanism.

13. A method according to claim 11 further comprising defining a sensor response envelope for the particular proximity sensor.

14. The method according to claim 11 wherein the high response curve is calculated as high response gap averages +3σ standard deviations, the low response curve is calculated as low response gap averages −3σ standard deviations, and on each of these curves, a curve-fitting approximation is applied to derive a curve-fit equation for the curves of the form $y=Ax^6+Bx^5+Cx^4+Dx^3+Ex^2+Fx+G$, where x=RC time decay, y=calculated gap, and A, B, C, D, E, F, G are coefficients.

15. The method according to claim 11 wherein providing a display comprises providing a display indication in inch units by correlating the discharge time with a distance between the sensor and the target.

16. The method according to claim 11 wherein providing a display comprises providing a display indication as a Go/No-Go indication by correlating the discharge time with a distance between the sensor and the target, and determining whether the correlated distance is within a defined tolerance.

17. The method according to claim 16 wherein providing a display indication as a Go/No-Go indication comprises providing a visual tool to indicate gap measurement between two limit bars shown on a display, the limit bars indicating a minimum gap requirement and a maximum gap requirement, respectively, as defined by a specific sensor and target installation.

18. The method according to claim 11 wherein measuring the discharge time comprises:
measuring a discharge time of the RC circuit multiple times; and
averaging the measured discharge times to determine a single discharge time for the RC circuit.

19. The method according to claim 11 further comprising selecting a resistance and capacitance for the RC circuit such that the capacitor is configured to charge quickly but have an adequate decay such that a useable discharge time results.

* * * * *